(12) United States Patent
Krishnamurthy et al.

(10) Patent No.: US 10,670,638 B2
(45) Date of Patent: Jun. 2, 2020

(54) LAYOUT FOR REDUCED CROSS-TALK IN COMMON TERMINAL TRANSISTOR

(71) Applicant: Texas Instruments Incorporated, Dallas, TX (US)

(72) Inventors: Vijay Krishnamurthy, Santa Clara, CA (US); Abidur Rahman, Richardson, TX (US); Min Chu, Plano, TX (US); Sualp Aras, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 15/947,389

(22) Filed: Apr. 6, 2018

(65) Prior Publication Data

US 2019/0137546 A1  May 9, 2019

Related U.S. Application Data

(60) Provisional application No. 62/583,701, filed on Nov. 9, 2017.

(51) Int. Cl.
| | |
|---|---|
| *G01R 19/10* | (2006.01) |
| *H01L 29/78* | (2006.01) |
| *G01R 19/00* | (2006.01) |
| *H03K 17/16* | (2006.01) |
| *H01L 29/735* | (2006.01) |

(Continued)

(52) U.S. Cl.
CPC ......... *G01R 19/10* (2013.01); *G01R 19/0092* (2013.01); *H01L 21/823487* (2013.01); *H01L 27/088* (2013.01); *H01L 29/0653* (2013.01); *H01L 29/735* (2013.01);

(Continued)

(58) Field of Classification Search
None
See application file for complete search history.

(56) References Cited

U.S. PATENT DOCUMENTS

| | | |
|---|---|---|
| 2008/0204958 A1 | 8/2008 | Shearon et al. |
| 2011/0062927 A1 | 3/2011 | Nagasawa et al. |

(Continued)

OTHER PUBLICATIONS

Search Report for PCT Application No. PCT/US18/59925, dated of the international search report Feb. 14, 2019 (1 page).

*Primary Examiner* — Jas A Sanghera
(74) *Attorney, Agent, or Firm* — Tuenlap Chan; Charles A. Brill; Frank D. Cimino

(57) ABSTRACT

A microelectronic device has a common terminal transistor with two or more channels, and sense transistors in corresponding areas of the channels. The channels and the sense transistors share a common node in a semiconductor substrate. The sense transistors are configured to provide sense currents that are representative of currents through the corresponding channels. The sense transistors are located so that a ratio of the channel currents to the corresponding sense currents have less than a target value of cross-talk. The microelectronic device may be implemented without a compensation circuit which provides a compensation signal used to adjust one or more of the sense currents to reduce cross-talk. A method of forming the microelectronic device, including estimating a potential distribution in the semiconductor substrate containing the common node of the common terminal transistor, and selecting locations for the sense transistors based on the estimated potential distribution, is disclosed.

20 Claims, 7 Drawing Sheets

(51) Int. Cl.
  *H01L 27/088* (2006.01)
  *H01L 29/06* (2006.01)
  *H01L 21/8234* (2006.01)

(52) U.S. Cl.
  CPC ...... *H01L 29/7815* (2013.01); *H01L 29/7827* (2013.01); *H03K 17/162* (2013.01)

(56) References Cited

U.S. PATENT DOCUMENTS

2016/0178670 A1* 6/2016 Bernacchia ......... H01L 29/7815
  324/76.11
2016/0313378 A1 10/2016 Duvjnak et al.
2017/0030948 A1 2/2017 Baldwin et al.

\* cited by examiner

LAYOUT FOR REDUCED CROSS-TALK IN COMMON TERMINAL TRANSISTOR

CROSS-REFERENCE TO RELATED APPLICATIONS

This application claims the benefit of priority under 35 U.S.C. § 119(e) of U.S. Provisional Application No. 62/583,701 (Texas Instruments docket number TI-78540PS), filed Nov. 9, 2017, which is hereby incorporated by reference in its entirety.

FIELD

This disclosure relates to the field of microelectronic devices. More particularly, this disclosure relates to common terminal transistors in microelectronic devices.

BACKGROUND

A widely used common terminal transistor is an n-channel metal oxide semiconductor (NMOS) transistor, with a common drain in an n-type semiconductor region, and two or more channels having sources of the common terminal transistor, controlled by separate gates. The common terminal NMOS transistor may be used to provide current through separate loads connected in series to the channels. The common terminal transistor has a sense NMOS transistor for each channel to monitor current through the corresponding channel. It is desirable to have current through each sense transistor to be representative of the current through the corresponding channel and to be independent of currents through the other channels, that is, to have low cross-talk. This is commonly attained by having a compensation circuit which provides a compensation signal used to adjust the current through the sense transistor to reduce the cross-talk. The compensation circuit increases the area of the microelectronic device containing the common terminal transistor, undesirably increasing fabrication cost.

SUMMARY

The present disclosure introduces a microelectronic device having a common terminal transistor with two or more channels, and sense transistors in corresponding areas of the channels. The channels and the sense transistors share a common node in a semiconductor region. The sense transistors are configured to provide sense currents that are representative of currents through the corresponding channels over an operational current range factor. The sense transistors are located so that a ratio of the channel currents to the corresponding sense currents have less than a target level of dependence on currents through the other channels. The microelectronic device may be implemented without a compensation circuit which provides a compensation signal used to adjust one or more of the sense currents to reduce cross-talk. The present disclosure introduces a method of forming the microelectronic device, including estimating a potential distribution in the semiconductor region containing the common node of the common terminal transistor, and selecting locations for the sense transistors based on the estimated potential distribution.

DETAILED DESCRIPTION

Figure 1:
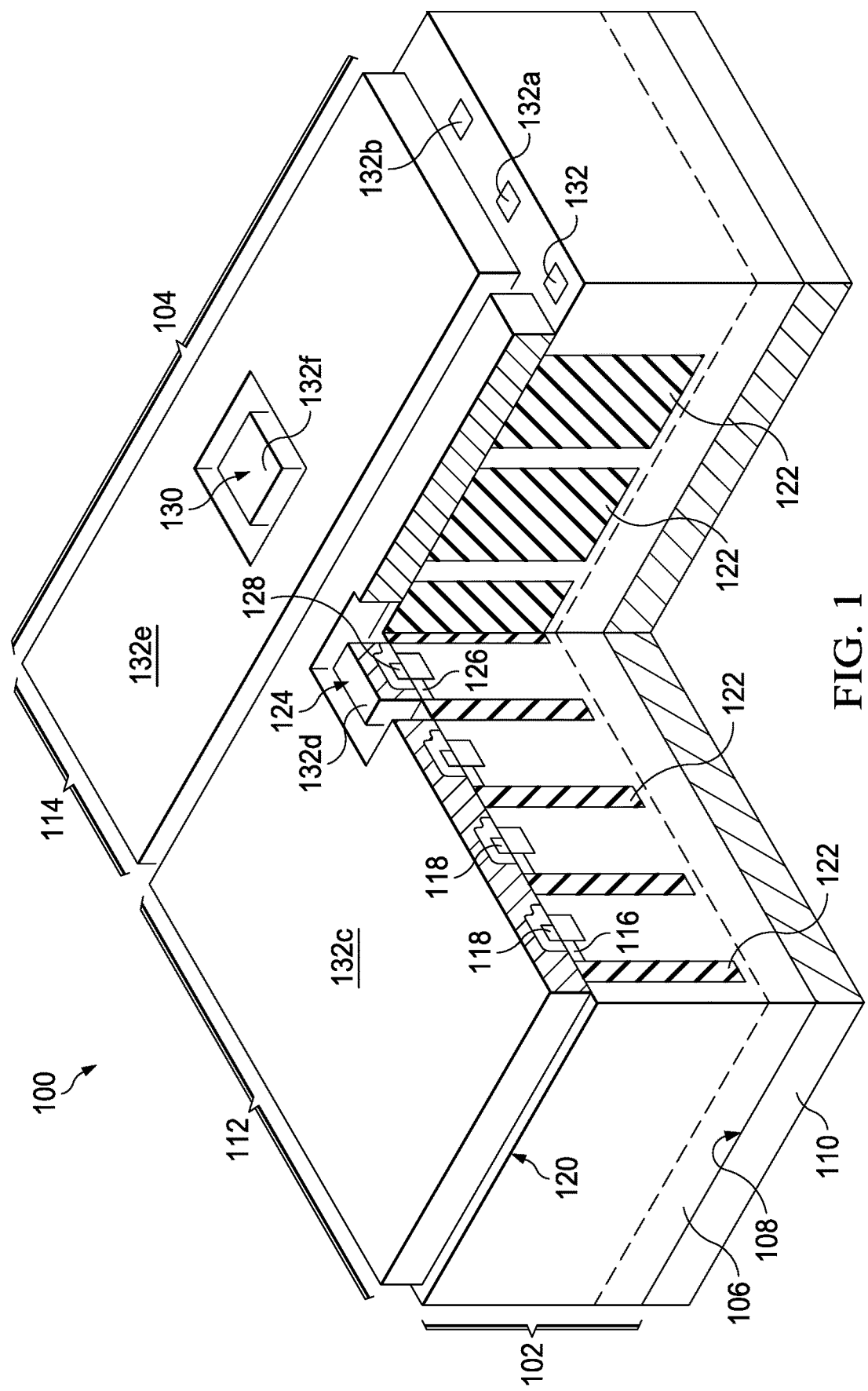
FIG. 1 is a cross section of an example microelectronic device having a common terminal transistor.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has a common terminal transistor with a common node in a semiconductor region. The common terminal transistor has two or more channels. The common terminal transistor may be, in one aspect, a common terminal n-channel metal oxide semiconductor (NMOS) transistor having a common drain in an n-type semiconductor region, and two or more channels having channel nodes which are source nodes. In this aspect, a first channel may be a first NMOS transistor, a first sense transistor may be a second NMOS transistor, a second channel may be a third NMOS transistor, and a second sense transistor may be a fourth NMOS transistor. Current through each channel is controlled by a corresponding gate. In another aspect, the common terminal transistor may be a common terminal NMOS transistor having a common source in an n-type semiconductor region, and two or more channels with channel nodes which are drain nodes, wherein current through each channel is controlled by a corresponding gate.

In a further aspect, the common terminal transistor may be a common terminal p-channel metal oxide semiconductor (PMOS) transistor having a common drain in a p-type semiconductor region, and two or more channels having channel nodes which are source nodes, with current through each channel being controlled by a corresponding gate. In yet another aspect, the common terminal transistor may be a common terminal PMOS transistor having a common source in a p-type semiconductor region, and two or more channels with channel nodes which are drain nodes, wherein current through each channel is controlled by a corresponding gate.

In another aspect of the instant disclosure, the common terminal transistor may be an NPN bipolar junction transistor having a common collector in an n-type semiconductor region, and two or more channels with channel nodes which are emitter nodes, with current through each channel being controlled by a corresponding base. In a further aspect, the common terminal transistor may be an NPN bipolar junction transistor having a common emitter in an n-type semiconductor region, and two or more channels with channel nodes which are collector nodes, with current through each channel being controlled by a corresponding base.

In a further aspect of the instant disclosure, the common terminal transistor may be a PNP bipolar junction transistor having a common collector in a p-type semiconductor region, and two or more channels with channel nodes which are emitter nodes, with current through each channel being controlled by a corresponding base. In a further aspect, the common terminal transistor may be a PNP bipolar junction transistor having a common emitter in a p-type semiconductor region, and two or more channels having channel nodes which are collector nodes, with current through each channel being controlled by a corresponding base.

In one aspect, the common terminal transistor may be a vertical transistor, in which the common node extends to a first surface of the microelectronic device, and the channels extend to a second surface of the microelectronic device which is opposite from the first surface. In this aspect, a first channel may be a first vertical transistor, a first sense transistor may be a second vertical transistor, a second channel may be a third vertical transistor, and a second sense transistor may be a fourth vertical transistor. In another aspect, the common terminal transistor may be a lateral transistor, in which the common node and the channels extend to a same surface of the microelectronic device. In this aspect, a first channel may be a first lateral transistor, a first sense transistor may be a second lateral transistor, a second channel may be a third lateral transistor, and a second sense transistor may be a lateral vertical transistor.

The common terminal transistor has a sense transistor for each channel. For the purposes of this disclosure, the term "sense transistor" does not imply the sense transistor is separate from the common terminal transistor, but rather, the term "sense transistor" is used to conform to common practice. Each sense transistor is part of the common terminal transistor wherein all the sense transistors and all the channels share the common node. The sense transistor has a same transistor type and polarity as the common terminal transistor. For example, in a case in which the common terminal transistor is an NMOS transistor, each sense resistor is also an NMOS transistor. Each sense transistor has a node that shares the common node with the channels. Each sense transistor has a sense node located at the same surface of the microelectronic device as the corresponding channel node. The sense transistor is located in the corresponding channel, wherein the corresponding channel is laterally adjacent to the sense transistor on at least three sides of the sense transistor, with two of the sides being opposite from each other. For the purposes of this disclosure, the term "laterally" refers to a direction parallel to a surface of the semiconductor substrate to which the common node extends. Each sense transistor is configured to provide a sense current that is representative of a channel current through the corresponding channel, according to a sense ratio. The relationship between the sense current and a corresponding channel current will be referred to herein as a sense ratio. In one aspect of this disclosure, the sense ratio may be a numerical ratio of the channel current to the sense current. In one aspect of this disclosure, the sense transistors may be configured to provide sense currents that are linearly proportional to the corresponding channel currents. In another aspect, the sense transistors may be configured to provide sense currents that are proportional to the corresponding channel currents, with offsets. Other relationships between the sense currents and the corresponding channel currents are within the scope of the instant disclosure. Examples in this disclosure will be described for linear relationships between the sense currents and the corresponding channel currents. Other relationships between the sense current and the corresponding channel current may be applied to the examples. The term sense ratio may be applied to these relationships without obscuring the specific relationship between the sense current and the corresponding channel current. The sense transistors are configured to provide sense currents that are representative of the corresponding channel currents over an operational current range factor of the channel currents encountered during operation of the microelectronic device. For example, the operational current range factor may be greater than 30 for a relatively small channel which has a maximum operating current of 3 amps. The operational current range factor may be greater than 100 for a larger channel which has a maximum operating current of 10 amps. The operational current range covers an expected range of channel currents during operation of the microelectronic device. The range factor is a ratio of an upper value of the operational current range to a lower value of the operational current range. In one aspect of this disclosure, the sense currents may be proportional to the corresponding channel currents. The sense transistors are located so that a ratio of the channel currents to the corresponding sense currents have less than a target level of dependence on channel currents through the other channels, that is, cross-talk. For the purposes of this disclosure, cross-talk is a ratio of the dependence of the sense current on channel currents through the other channels to the dependence of the sense current on the corresponding channel current. For example, the target level of cross-talk may be less than 1 percent.

The microelectronic device may be implemented without a compensation circuit which samples the substrate potential in the semiconductor region of the common node proximate to one or more of the other channel nodes, and provides a compensation signal used to adjust one or more of the sense currents through the sense transistors to reduce the cross-talk. An example compensation circuit is disclosed in U.S. Patent Publication 2017/0030948A1.

The microelectronic device may be formed by estimating a potential distribution in a semiconductor region containing a common node of the common terminal transistor, and selecting locations for the sense transistors based on the estimated potential distribution. The potential distribution may be estimated by solving Poisson's equation for the specific orientation of the common node and channels. The estimated potential distribution that was attained by solving Poisson's equation may be further refined by using a three dimensional modeling software program.

Locations for the sense nodes are selected using the estimated potential distribution. A semiconductor substrate is provided having an area for the microelectronic device. An ion implant mask is generated on the semiconductor substrate which exposes areas for the sense nodes at the selected locations, and areas for the corresponding channel nodes. The area for each channel node is laterally adjacent to the corresponding sense node on at least three sides of the sense node, with two of the sides being opposite from each other. Dopants are implanted into the semiconductor substrate to form doped regions for the channel nodes and the corresponding sense nodes. A compensation circuit is not formed in the microelectronic device.

FIG. 1 is a cross section of an example microelectronic device having a common terminal transistor. The microelectronic device 100 has a semiconductor substrate 102, which may include silicon or other semiconductor substrate. The microelectronic device 100 includes the common terminal transistor 104. The instant example will disclose a vertical common terminal NMOS transistor 104. Other transistor types, polarities, and orientations of the common terminal transistor 104 are within the scope of the instant example. The common terminal transistor 104 has a common drain 106 extending to a first surface 108 of the semiconductor substrate 102. The microelectronic device 100 may have a drain terminal 110 including a metal contact layer on the first surface 108, making electrical contact to the common drain 106.

The common terminal transistor 104 of the instant example includes a first channel 112 and a second channel 114. The first channel 112 and the second channel 114 have a same transistor type, for example, metal oxide semiconductor (MOS) or bipolar junction. The first channel 112 and the second channel 114 have a same polarity, for example, n-channel, p-channel, NPN, or PNP. The first channel 112 and the second channel 114 have a same orientation, for example, lateral or vertical. The first channel 112 and the second channel 114 share the common drain 106.

The first channel 112 includes a first channel source 116 and a first channel gate 118, proximate to a second surface 120 of the semiconductor substrate 102. In the instant example, for a vertical orientation of the common terminal transistor 104, the second surface 120 is different from the first surface 108 and is located at a surface of the semiconductor substrate 102 opposite from the first surface 108. The first channel 112 may have vertical separators 122, manifested as deep trenches 122, in the semiconductor substrate 102 to provide a desired drain structure between the common drain 106 and the first channel source 116. The first channel source 116 and the first channel gate 118 may be distributed throughout the first channel 112, as indicated in FIG. 1.

The common terminal transistor 104 includes a first sense transistor 124. The first sense transistor 124 has the same transistor type, polarity, and orientation as the first channel 112, which, in the instant example, is a vertical NMOS transistor. The first sense transistor 124 shares the common drain 106 with the first channel 112 and the second channel 114. The first sense transistor 124 has a first sense source 126 and a first sense gate 128. The first sense transistor 124 is located in the first channel 112, wherein the first channel 112 is laterally adjacent to the first sense transistor 124 on at least three sides of the first sense transistor 124, with two of the sides being opposite from each other.

The first sense transistor 124 is configured to provide a first sense current that is representative of a first channel current through the first channel 112 over an operational current range, for example an operational current range factor greater than 30 to greater than 100, depending on the current capacity of the first channel 112. In one example, the first sense current may be proportional to the first channel current. The first sense transistor 124 is located so that a ratio of the first channel current to the first sense current, referred to as a first sense ratio, has less than a target level of cross-talk, for example, less than 1 percent cross-talk. The first sense gate 128 of the first sense transistor 124 may be electrically coupled to the first channel gate 118 of the first channel 112, to provide a desired relationship between the first sense current and the first channel current.

The second channel 114 has a same configuration as the first channel 112. In the instant example, the second channel 114 may be smaller than the first channel 112, as indicated in FIG. 1. In other versions of the instant example, the second channel 114 may the same size as the first channel 112, or may be larger than the first channel 112. The second channel 114 has a second channel source, not shown in FIG. 1, and a second channel gate, also not shown in FIG. 1, which may be distributed throughout the second channel 114, similarly to the first channel source 116 and the first channel gate 118.

The common terminal transistor 104 includes a second sense transistor 130. The second sense transistor 130 has the same transistor type, polarity, and orientation as the first channel 112. The second sense transistor 130 shares the common drain 106 with the first channel 112 and the second channel 114. The second sense transistor 130 has a second sense source, not shown in FIG. 1, and a second sense gate, also not shown in FIG. 1, similar to the first sense source 126 and the first sense gate 128. The second sense transistor 130 is located in the second channel 114, wherein the second channel 114 is laterally adjacent to the second sense transistor 130 on at least three sides of the second sense transistor 130, with two of the sides being opposite from each other. The second sense gate of the second sense transistor 130 may be electrically coupled to the second channel gate of the second channel 114, to provide a desired relationship between the second sense current and the second channel current.

The second sense transistor 130 is configured to provide a second sense current that is representative of a second channel current through the second channel 114 over an operational current range, for example, an operational current range factor greater than 30 to greater than 100, depending on the current capacity of the second channel 114. The second sense current may be proportional to the second channel current. The second sense transistor 130 is located so that a ratio of the second channel current to the second sense current, referred to as a second sense ratio, has less than a target level of cross-talk, for example, less than 1 percent cross-talk.

The microelectronic device 100 may include pads 132, such as bond pads or bump pads, providing connections to the first channel source 116, the first channel gate 118, the first sense source 126, the first sense gate 128, the second channel source, the second channel gate, the second sense source, and the second sense gate. The first channel gate 118 and the first sense gate 128 may optionally be coupled to a first pad 132a of the pads 132, and the second channel gate and the second sense gate may optionally be coupled a second pad 132b of the pads 132.

The first channel source 116 may be contacted by a first channel terminal 132c, which may be manifested as a portion of a metal layer extending over the first channel 112, as depicted in FIG. 1. The first sense source 126 may be contacted by a first sense terminal 132d, which may be manifested by another portion of the metal layer providing the first channel terminal 132c. Similarly, the second channel source may be contacted by a second channel terminal 132e, which may be manifested as a further portion of the metal layer extending over the second channel 114, as depicted in FIG. 1. The second sense source may be contacted by a second sense terminal 132f, which may be manifested by yet another portion of the metal layer providing the first channel terminal 132c. Connections to the first channel terminal 132c, the first sense terminal 132d, the second channel terminal 132e, and the second sense terminal 132f may be provided by wire bonds, bump bonds, solder clips, or other connections.

The microelectronic device 100 may be implemented without a compensation circuit which samples the substrate potential in the semiconductor region of the common node under one or more of the other channels, and provides a compensation signal used to adjust the current through the channel to reduce the cross-talk. Having the microelectronic device 100 without a compensation circuit may enable a smaller area for the microelectronic device 100 compared to a similar microelectronic device having a compensation circuit, advantageously reducing a fabrication cost of the microelectronic device 100 compared to the similar microelectronic device with the compensation circuit.

Figure 2:
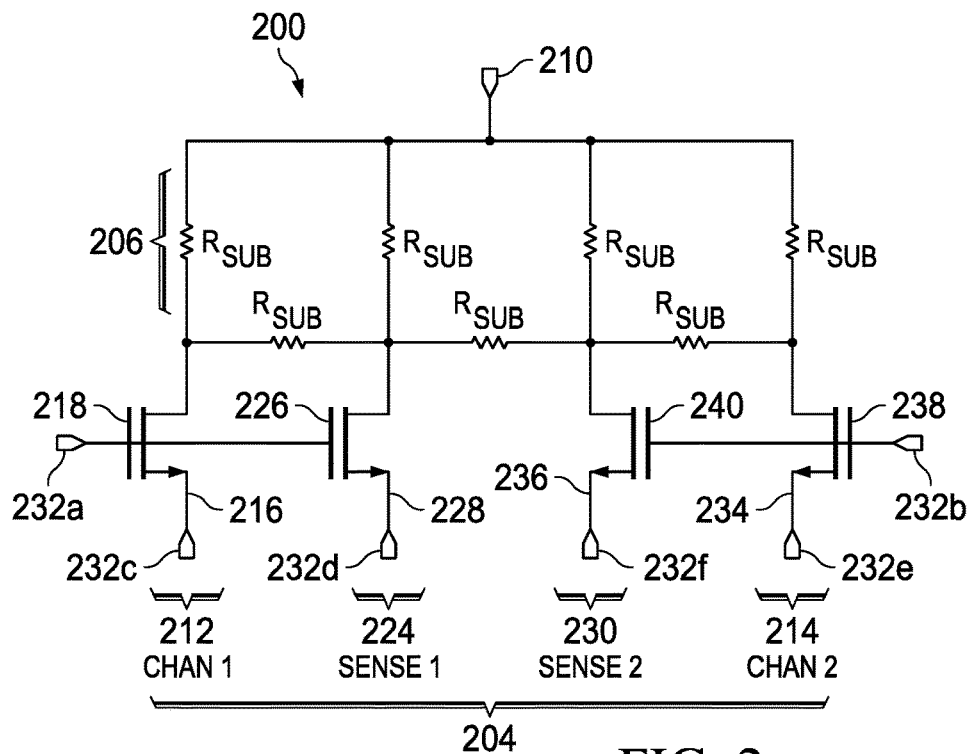
FIG. 2 is a circuit diagram of an example microelectronic device containing a common terminal transistor.

FIG. 2 is a circuit diagram of an example microelectronic device containing a common terminal transistor. The microelectronic device 200 includes the common terminal transistor 204, which has a first channel 212 labeled "CHAN 1" in FIG. 2, a first sense transistor 224 labeled "SENSE 1", a second channel 214 labeled "CHAN 2", and a second sense transistor 230 "SENSE 2", all configured in parallel. The first channel 212, the first sense transistor 224, the second channel 214, and the second sense transistor 230 share a common node 206 which is a common drain 206 in the instant example, and which has a distributed resistance indicated schematically in FIG. 2 by the resistor network with resistive elements labeled "$R_{SUB}$". The common drain 206 is connected to a drain terminal 210 of the microelectronic device 200.

A first channel source 216 of the first channel 212 may be connected to a first channel terminal 232c of the microelectronic device 200. A first sense source 226 may be connected to a first sense terminal 232d of the microelectronic device 200. A second channel source 234 of the second channel 214 may be connected to a second channel terminal 232e of the microelectronic device 200. A second sense source 236 may be connected to a second sense terminal 232f of the microelectronic device 200. A first channel gate 218 of the first channel 212 and a first sense gate 228 of the first sense transistor 224 may be connected to a first gate terminal 232a of the microelectronic device 200. A second channel gate 238 of the second channel 214 and a second sense gate 240 of the second sense transistor 230 may be connected to a second gate terminal 232b of the microelectronic device 200.

During operation of the microelectronic device 200, a first load may be connected to the first channel terminal 232c, so that a first load current flows through the first channel 212. The first load current may be adjusted by varying a first bias potential applied to the first gate terminal 232a. A first sense circuit may be connected to the first sense terminal 232d and to the first channel terminal 232c; the first sense circuit may be configured to produce a first sense current through the first sense transistor 224 which is representative of the first load current. Similarly, a second load may be connected to the second channel terminal 232e, so that a second load current flows through the second channel 214. The second load current may be adjusted by varying a second bias potential applied to the second gate terminal 232b. A second sense circuit may be connected to the second sense terminal 232f and to the second channel terminal 232e; the second sense circuit may be configured to produce a second sense current through the second sense transistor 230 which is representative of the second load current. The first sense circuit is not directly connected to the second channel terminal 232e or the second sense terminal 232f, nor is the second sense circuit directly connected to the first channel terminal 232c or the first sense terminal 232d.

Figure 3:
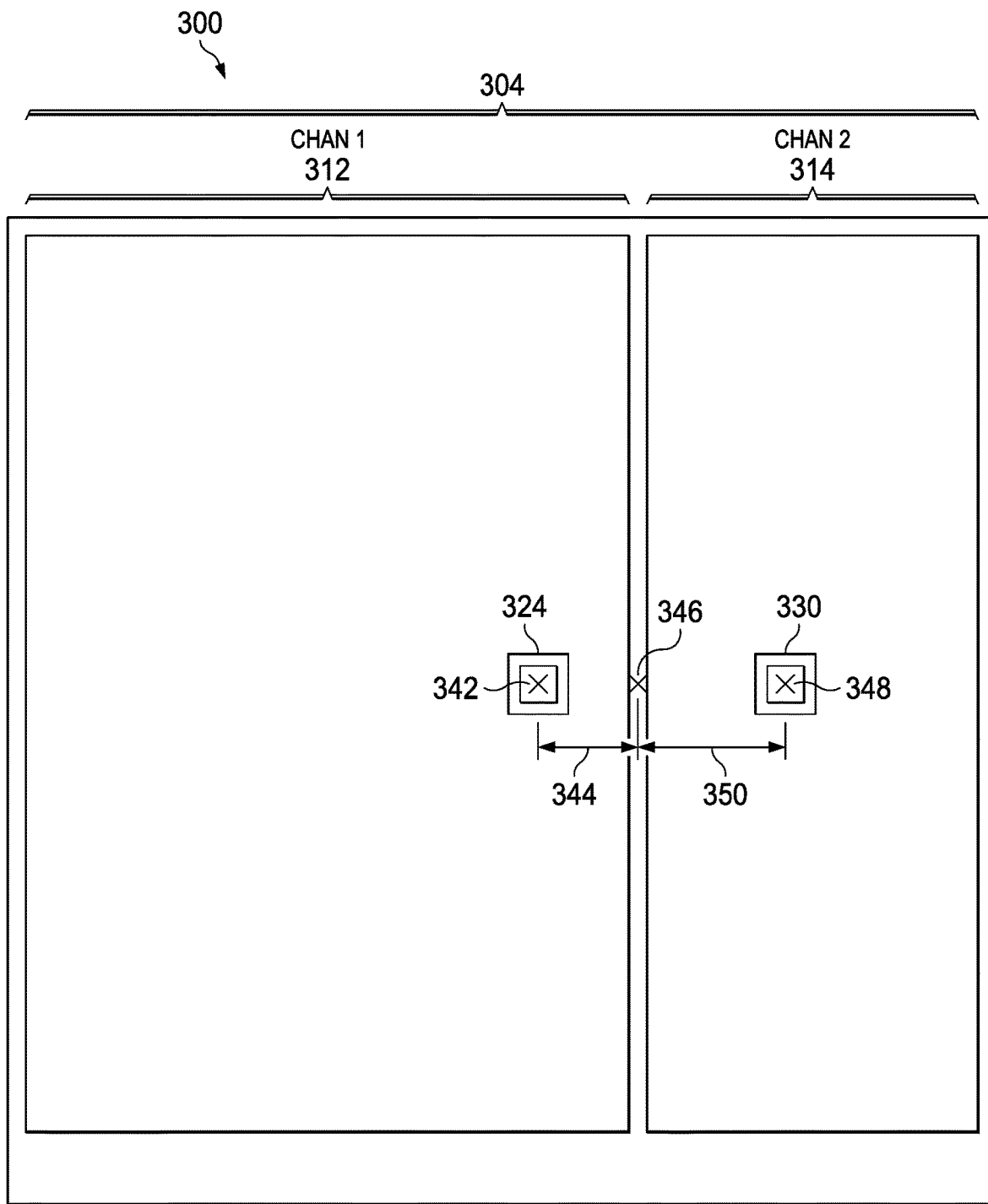
FIG. 3 is a top view of an example microelectronic device containing a common terminal transistor.

FIG. 3 is a top view of an example microelectronic device containing a common terminal transistor. The microelectronic device 300 includes the common terminal transistor 304 which has a first channel 312 labeled "CHAN 1" in FIG. 3, and a second channel 314 labeled "CHAN 2", adjacent to the first channel 312. In this example, the first channel 312 may be larger than the second channel 314, as depicted in FIG. 3.

The common terminal transistor 304 includes a first sense transistor 324 located in the first channel 312, wherein the first channel 312 is laterally adjacent to the first sense transistor 324 on at least three sides of the first sense transistor 324, with two of the sides being opposite from each other. The first sense transistor 324 is located so that a ratio of a first channel current through the first channel 312 to a first sense current through the first sense transistor 324, referred to as a first sense ratio, has less than a target value of cross-talk, for example less than 1 percent cross-talk. A first center 342 of the first sense transistor 324 is located a first lateral distance 344 from a center point 346 between the first channel 312 and the second channel 314.

The common terminal transistor 304 includes a second sense transistor 330 located in the second channel 314, wherein the second channel 314 is laterally adjacent to the second sense transistor 330 on at least three sides of the second sense transistor 330, with two of the sides being opposite from each other. The second sense transistor 330 is located so that a ratio of a second channel current through the second channel 314 to a second sense current through the second sense transistor 330 has less than the target value of cross-talk. A second center 348 of the second sense transistor 330 is located a second lateral distance 350 from the center point 346 between the first channel 312 and the second channel 314. In this example, the first lateral distance 344 is less than the second lateral distances 350, as a result of the first channel 312 being larger than the second channel 314.

Figure 4:
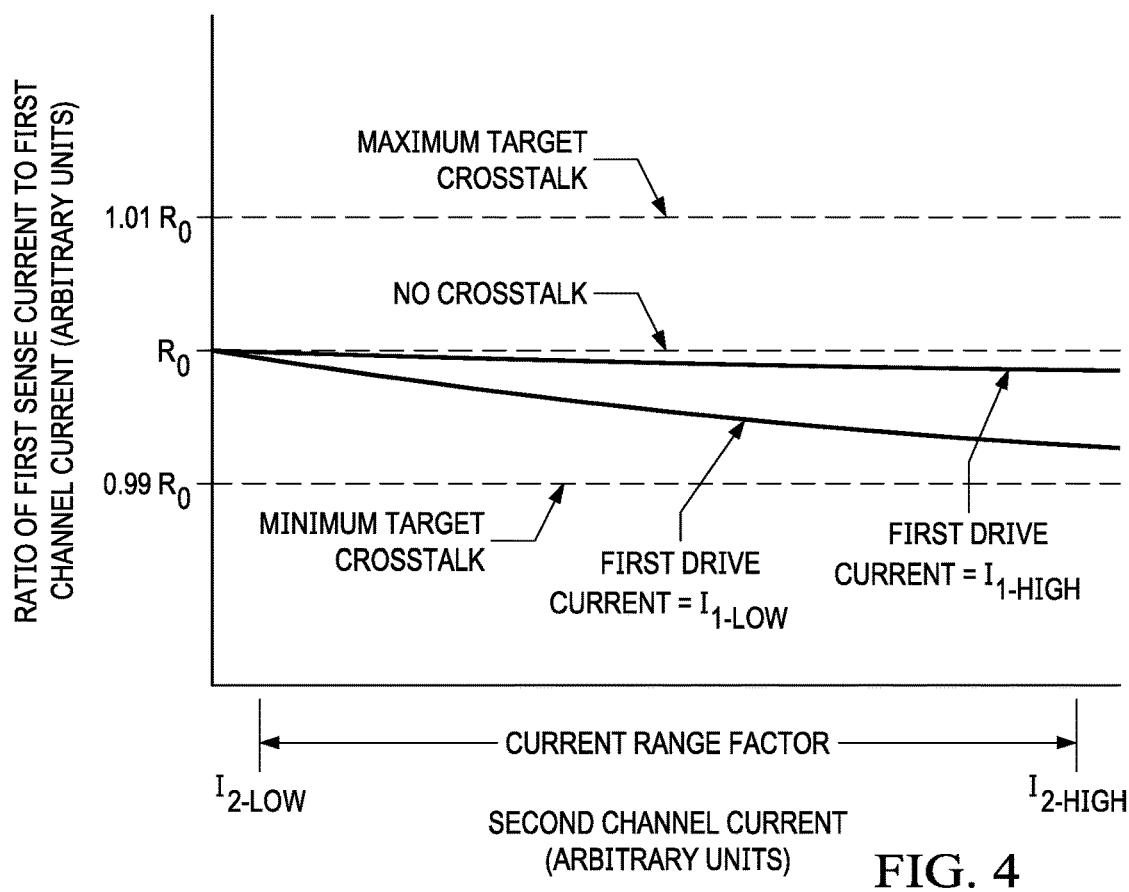
FIG. 4 is a chart illustrating cross-talk of a sense transistor in a common terminal transistor.

FIG. 4 is a chart illustrating cross-talk of a sense transistor in a common terminal transistor. For example purposes, the common terminal transistor may be configured as disclosed in reference to FIG. 2, having a first channel, a first sense transistor located in the first channel, a second channel, and a second sense transistor located in the second channel.

The horizontal axis of the chart quantifies a second channel current through the second channel. The second channel current includes an operational current range from $I_{2-LOW}$ to $I_{2-HIGH}$, as indicated in FIG. 4. The second channel current may have an operational current range factor greater than 30.

The vertical axis of the chart quantifies a ratio of a first channel current through the first channel to a first sense current through the first sense transistor, referred to as a first sense ratio. A value of the first sense ratio, for a condition of zero second channel current, is labeled "$R_0$" on the vertical axis in FIG. 4.

A desired operating condition is for the first sense ratio to be constant across the current range of the second channel current, that is, for the first sense ratio to maintain the value $R_0$ across the current range of the second channel current. This desired operating condition is depicted in the chart by the horizontal dashed line labeled "NO CROSS-TALK" in FIG. 4.

A condition of +1 percent cross-talk occurs when the first sense ratio increases by 1 percent from the value $R_0$, that is, to a value 1.01 $R_0$. The condition of +1 percent cross-talk is depicted in the chart by the horizontal dashed line labeled "+1 PERCENT CROSS-TALK" in FIG. 4. Similarly, a condition of −1 percent cross-talk occurs when the first sense ratio decreases by 1 percent from the value $R_O$, that is, to a value 0.99 $R_O$. The condition of −1 percent cross-talk is depicted in the chart by the horizontal dashed line labeled "−1 PERCENT CROSS-TALK" in FIG. 4.

A first performance curve depicts the first sense ratio for a value of the first channel current equal to a lower range value, $I_{1-LOW}$, as a function of the second channel current. The first performance curve is labeled "FIRST DRIVE CURRENT=$I_{1-LOW}$" in FIG. 4. A second performance curve depicts the first sense ratio for a value of the first channel current equal to an upper range value, $I_{1-HIGH}$, as a function of the second channel current. The second performance curve is labeled "FIRST DRIVE CURRENT=$I_{1-HIGH}$" in FIG. 4. The upper range value, $I_{1-HIGH}$, of the first channel current is an upper value of an operational current range of the first channel current, and $I_{1-LOW}$ is a lower value of the operational current range of the first channel current. Forming the common terminal transistor with the first sense transistor located so that the first sense ratio has less than the target level cross-talk is manifested by both the first performance curve and the second performance curve lying between the horizontal dashed lines indicating the condition of the maximum target cross-talk and the condition of the minimum target cross-talk, that is, the lines labeled MAXIMUM TARGET CROSS-TALK" and "MINIMUM TARGET CROSS-TALK" in FIG. 4. This condition of the cross-talk being with the maximum and minimum target cross-talk values is depicted in FIG. 4.

A similar chart to the chart of FIG. 4 may be generated for a ratio of a second channel current through the second channel to the second sense current, referred to as a second sense ratio, as a function of the first channel current. Forming the common terminal transistor with the second sense transistor located so that the second sense ratio has less than the target cross-talk level is manifested by performance curves of the second sense ratio lying between the condition of the maximum cross-talk target level and the condition of the minimum cross-talk target level. The performance curves span an operational current range of the second channel current.

Figure 5:
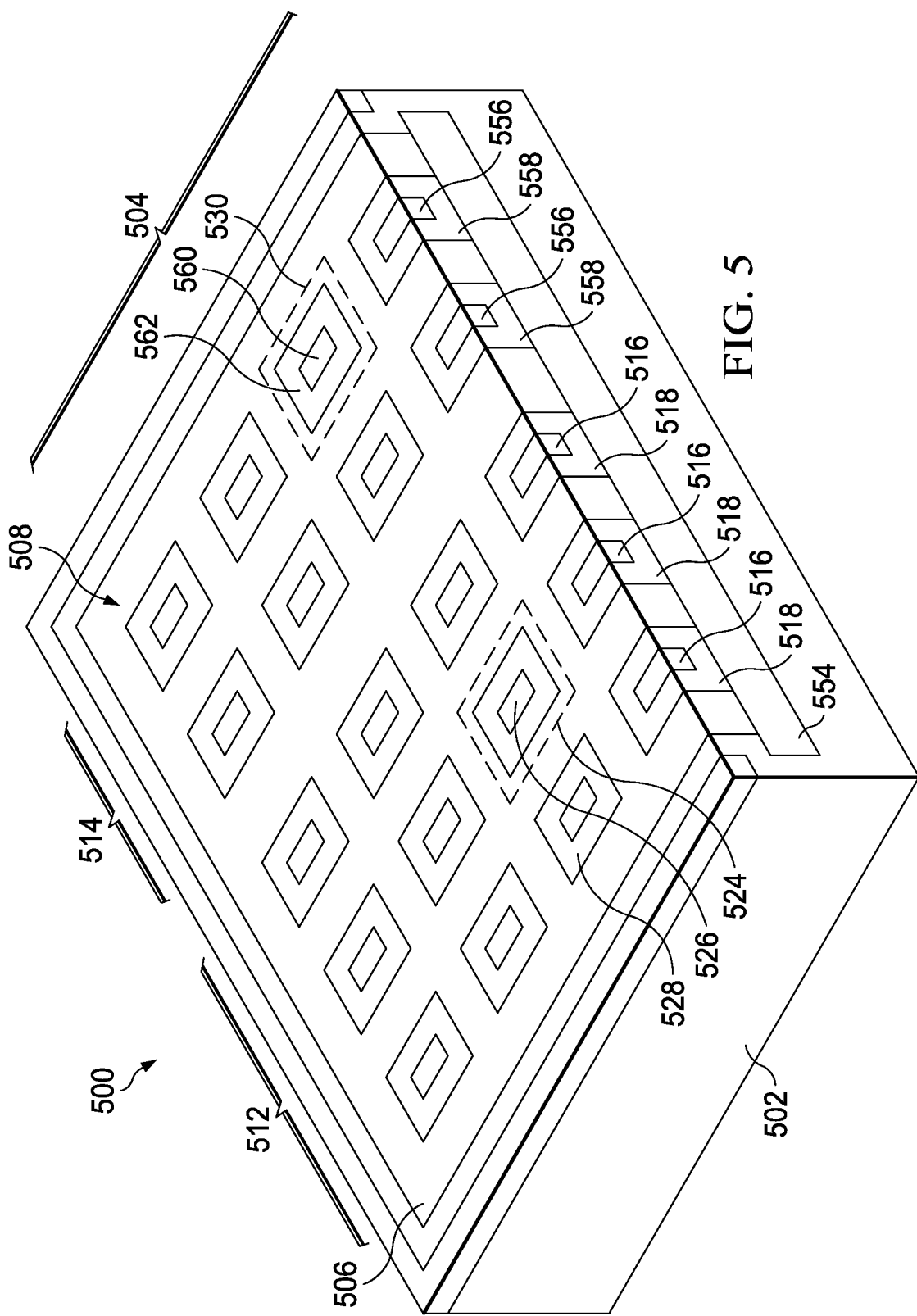
FIG. 5 is a cross section of another example microelectronic device having a common terminal transistor.

FIG. 5 is a cross section of another example microelectronic device having a common terminal transistor. The microelectronic device 500 has a semiconductor substrate 502, and the common terminal transistor 504. The instant example will disclose a lateral common terminal NPN bipolar junction transistor 504. Other transistor types, polarities, and orientations of the common terminal transistor 504 are within the scope of the instant example. The common terminal transistor 504 has a common node 506 which is a common collector 506 in the instant example. The common collector 506 extends to a first surface 508 of the semiconductor substrate 502. The common collector 506 may contact an n-type buried layer 554 located in the semiconductor substrate 502. The common terminal transistor 504 of the instant example includes a first channel 512 and a second channel 514. The first channel 512 and the second channel 514 have a same transistor type, a same polarity, and a same orientation. The first channel 512 and the second channel 514 share the common collector 506.

The first channel 512 includes a first channel emitter 516 and a first channel base 518, extending to the first surface 508. The first channel emitter 516 and the first channel base 518 may be distributed throughout the first channel 512, as indicated in FIG. 5. The common terminal transistor 504 includes a first sense transistor 524. The first sense transistor 524 has the same transistor type, polarity, and orientation as the first channel 512, which, in the instant example, is a lateral NPN bipolar junction transistor. The first sense transistor 524 shares the common collector 506 with the first channel 512 and the second channel 514. The first sense transistor 524 has a first sense emitter 526 and a first sense base 528. The first sense transistor 524 is located in the first channel 512, wherein the first channel 512 is laterally adjacent to the first sense transistor 524 on at least three sides of the first sense transistor 524, with two of the sides being opposite from each other. The first sense transistor 524 is configured to provide a first sense current that is representative of a first channel current through the first channel 512 over an operational current range. The first sense transistor 524 is located so that a ratio of the first channel current to the first sense current, referred to as a first sense ratio, has less than a target cross-talk level.

The second channel 514 has a same configuration as the first channel 512. In the instant example, the second channel 514 may be smaller than the first channel 512, as indicated in FIG. 5. In other versions of the instant example, the second channel 514 may the same size as the first channel 512, or may be larger than the first channel 512. The second channel 514 has a second channel emitter 556 and a second channel base 558, which may be distributed throughout the second channel 514, similarly to the first channel emitter 516 and the first channel base 518.

The common terminal transistor 504 includes a second sense transistor 530. The second sense transistor 530 has the same transistor type, polarity, and orientation as the first channel 512. The second sense transistor 530 shares the common collector 506 with the first channel 512 and the second channel 514. The second sense transistor 530 has a second sense emitter 560 and a second sense base 562, similar to the first sense emitter 526 and the first sense base 528. The second sense transistor 530 is located in the second channel 514, wherein the second channel 514 is laterally adjacent to the second sense transistor 530 on at least three sides of the second sense transistor 530, with two of the sides being opposite from each other. The second sense transistor 530 is configured to provide a second sense current that is representative of a second channel current through the second channel 514 over an operational current range. The second sense transistor 530 is located so that a ratio of the second channel current to the second sense current, referred to as a second sense ratio, has less than a target cross-talk level. The microelectronic device 500 is free of a compensation circuit, which may accrue the advantage discussed in reference to FIG. 1.

Figure 6:
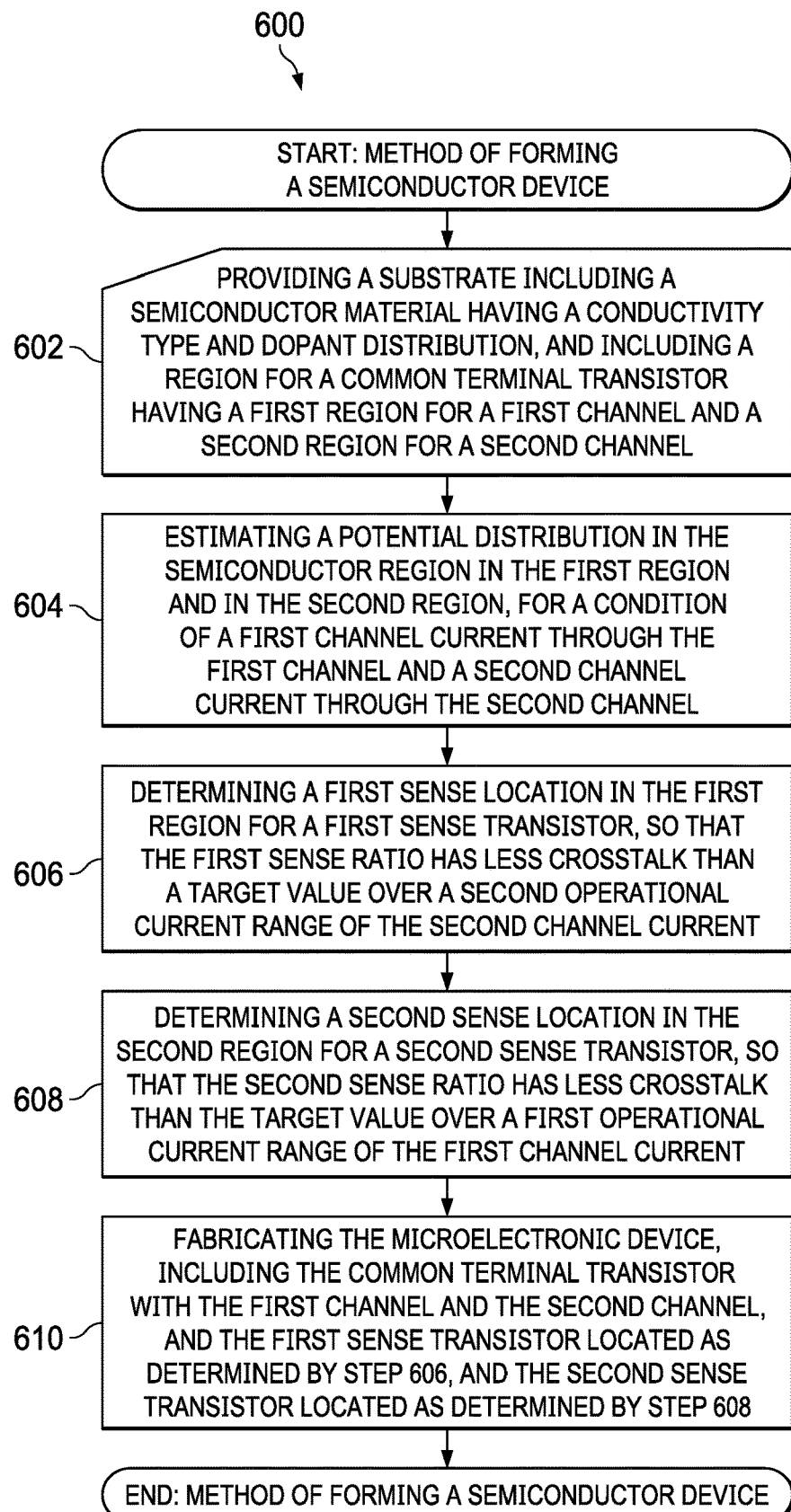
FIG. 6 is a flowchart disclosing an example method of forming a microelectronic device containing a common terminal transistor.

FIG. 6 is a flowchart disclosing an example method of forming a microelectronic device containing a common terminal transistor. The method 600 begins with step 602: providing a semiconductor substrate. For example, the semiconductor substrate may include a portion of a semiconductor wafer. The substrate includes a region for a common terminal transistor. The common terminal transistor includes a common node, which may include, for example, a common drain, a common source, a common collector, or a common emitter. The common terminal transistor may include features of any of the examples disclosed herein with respect to FIG. 1, FIG. 3, and FIG. 5. The region for a common terminal transistor includes a first region for a first channel of the common terminal transistor, and a region for a second channel of the common terminal transistor.

Step 604 is estimating a potential distribution in the semiconductor region in the first region and in the second region, for a condition of a first channel current through the first channel and a second channel current through the second channel. The potential distribution may have a common node value across the common node. The potential distribution may have a first channel value across a first distributed channel node of the first channel, and may have a second channel value across a second distributed channel node of the second channel.

Step 606 is determining a first sense location in the first region for a first sense transistor. The first sense transistor is configured to provide a first sense ratio over a first operational current range of the first channel current. The first sense location is selected so that the first sense ratio has less than a target cross-talk level over a second operational current range of the second channel current. The first sense location is selected so that the first channel is laterally adjacent to the first sense transistor on at least three sides of the first sense transistor, with two of the sides being opposite from each other.

Step 608 is determining a second sense location in the second region for a second sense transistor. The second sense transistor is configured to provide a second sense ratio over the second operational current range of the second channel current. The second sense location is selected so that the second sense ratio has less than the target cross-talk level over the first operational current range of the first channel current. The second sense location is selected so that the second channel is laterally adjacent to the second sense transistor on at least three sides of the second sense transistor, with two of the sides being opposite from each other.

Step 610 is fabricating the microelectronic device, including the common terminal transistor with the first channel and the second channel, and the first sense transistor located as determined by step 606, and the second sense transistor located as determined by step 608. Fabrication of the microelectronic device may include forming a mask to define placement of dopants into the semiconductor substrate. The mask defines areas for the first channel, the first sense transistor, the second channel, and the second sense transistor. In versions of the instant example in which the common terminal transistor is an MOS transistor having a common drain, the mask may define areas for placement of dopants to form sources of the first channel, the first sense transistor, the second channel, and the second sense transistor. In versions of the instant example in which the common terminal transistor is a bipolar junction transistor having a common collector, the mask may define areas for placement of dopants to form emitters of the first channel, the first sense transistor, the second channel, and the second sense transistor. The mask may be an ion implant mask or a diffusion mask. The mask may include photoresist, and may be formed by a photolithographic process. The mask may include polymer and may be formed by an additive process such as an ink jet process. The mask may include inorganic material such as silicon dioxide or silicon nitride, suitable for a diffusion mask. Masks having other materials and formed by other methods are within the scope of the instant example.

Figure 7:
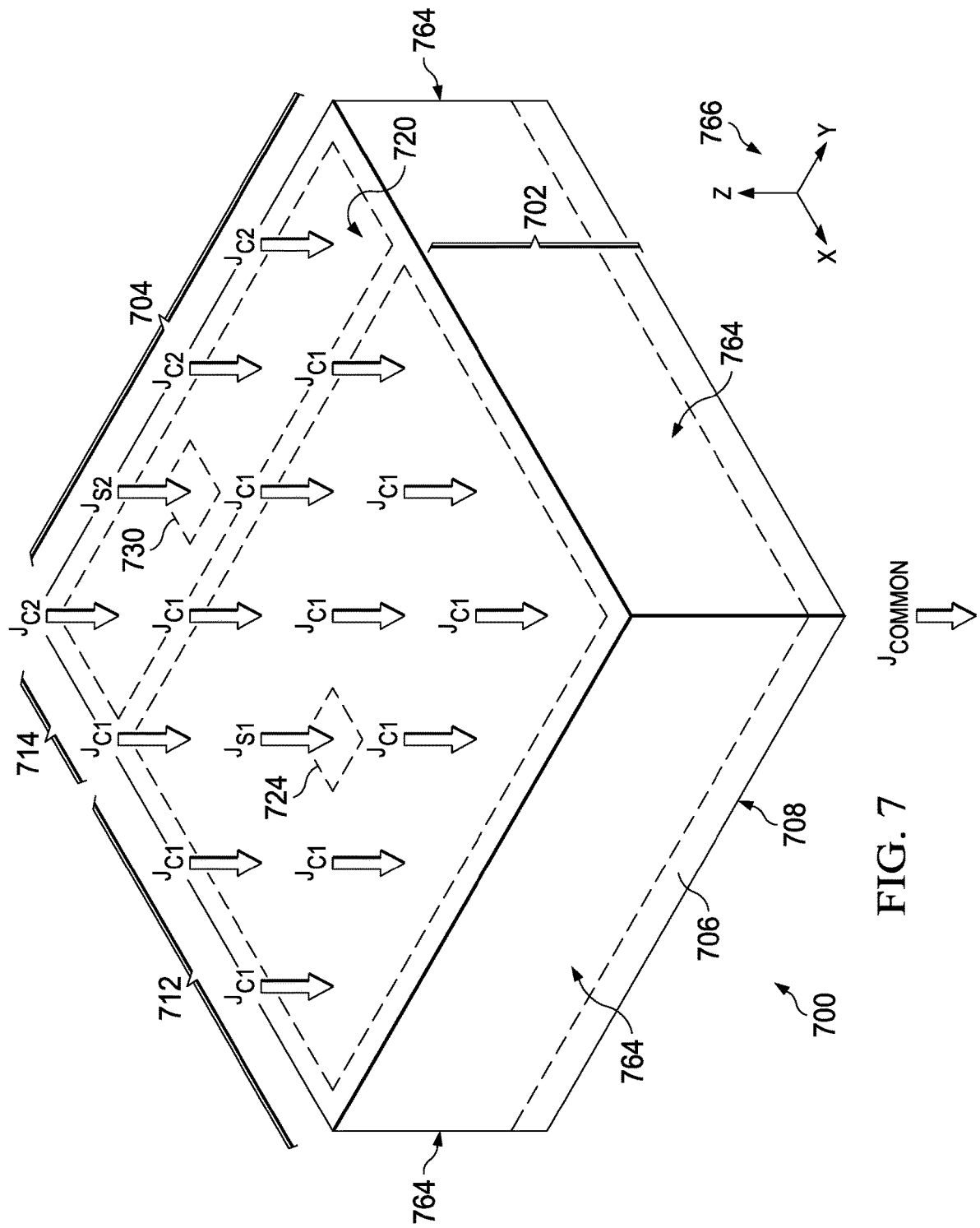
FIG. 7 is a view of an example microelectronic device having a common terminal transistor, depicting current flows into and out of the microelectronic device.

FIG. 7 is a view of an example microelectronic device having a common terminal transistor, depicting current flows into and out of the microelectronic device. The microelectronic device 700 has a semiconductor substrate 702, and the common terminal transistor 704. The instant example will describe a vertical common terminal transistor 704. Other transistor orientations are within the scope of the instant example. The common terminal transistor 704 has a common node 706 extending to a first surface 708 of the semiconductor substrate 702. For some examples, the common node 706 may include a common drain, or a common source, for MOS versions of the common terminal transistor 704. For other examples, the common node 706 may include a common collector, or a common emitter, for bipolar junction versions of the common terminal transistor 704.

The common terminal transistor 704 includes a first channel 712, a first sense transistor 724, a second channel 714, and a second sense transistor 730. The first sense transistor 724 is located in the first channel 712, so that the first channel 712 is laterally adjacent to the first sense transistor 724 on at least three sides of the first sense transistor 724, with two of the sides being opposite from each other. Similarly, the second sense transistor 730 is located in the second channel 714, so that the second channel 714 is laterally adjacent to the second sense transistor 730 on at least three sides of the second sense transistor 730, with two of the sides being opposite from each other. In the instant example, the first channel 712 includes a first channel node located proximate to a second surface 720 of the semiconductor substrate 702. The second surface 720 is different from the first surface 708 and is located at a surface of the semiconductor substrate 702 opposite from the first surface 708. Similarly, the first sense transistor 724 includes a first sense node located proximate to the second surface 720. The second channel 714 and the second sense transistor 730 include a second channel node and a second sense node, respectively, located proximate to the second surface 720. In versions of the instant example in which the common node 706 is a common drain, the first channel node is a source of the first channel 712, and so on, for the first sense transistor 724, the second channel 714, and the second sense transistor 730. In versions in which the common node 706 is a common source, the first channel node is a drain of the first channel 712, and so on. In versions in which the common node 706 is a common collector, the first channel node is an emitter of the first channel 712, and so on. In versions in which the common node 706 is a common emitter, the first channel node is a collector of the first channel 712, and so on.

In the instant example, in which the common terminal transistor 704 has a vertical orientation, current flow into the first channel 712 may be represented as a uniform first channel current density, denoted "$J_{C1}$" in FIG. 7, into the second surface 720, distributed across a first channel node of the first channel 712. Similarly, current flow into the second channel 714 may be represented as a uniform second channel current density, denoted "$J_{C2}$" in FIG. 7, into the second surface 720, distributed across a second channel node the second channel 714. Current flow into the first sense transistor 724 may be represented as a first sense current density, denoted "$J_{S1}$" in FIG. 7, into the second surface 720, distributed across a first sense node of the first sense transistor 724. The first sense current density may be similar in magnitude to the first channel current density. Similarly, current flow into the second sense transistor 730 may be represented as a second sense current density, denoted "$J_{S2}$" in FIG. 7, into the second surface 720, distributed across a second sense node of the second sense transistor 730. The second sense current density may similarly be similar in magnitude to the second channel current density.

Current flow out of the common terminal transistor 704 may be represented as a common current density, denoted "$J_{COMMON}$" in FIG. 7, through the common node 706 distributed across the first surface 708. The common current density may or may not be uniformly distributed across the first surface 708, depending on the first channel current density and the second channel current density.

A potential distribution of an electrical potential in the semiconductor substrate 702 may be estimated by solving Poisson's equation in the semiconductor substrate 702, with boundary conditions which include the first and second channel current densities into the first channel 712 and the second channel 714, respectively, at the second surface 720, and the common current density out of the common terminal transistor 704 through the common node 706 and then through the first surface 708. Further boundary conditions may include no current flow through lateral surfaces 764 of the semiconductor substrate 702. Poisson's equation may be expressed in the form of Equation 1:

$$d^2V(x,y,z)/dx^2 + d^2V(x,y,z)/dy^2 + d^2V(x,y,z)/dz^2 = 0 \quad (1)$$

Where V(x,y,z) is the electrical potential at a point with coordinates x, y, and z. A coordinate axis 766 is shown in FIG. 7 for reference.

The boundary conditions at the lateral surfaces 764 may be expressed in the form of Equation 2 and 3:

$$dV(x,y,z)/dx \, I_{x=0,a} = 0 \quad (2)$$

$$dV(x,y,z)/dy \, I_{y=0,b} = 0 \quad (3)$$

Where a and b are the lateral dimensions of the semiconductor substrate 702 in the x and y directions, respectively.

The boundary condition of the common current density at the first surface 708 may be expressed in the form of equation 4:

$$dV(x,y,z)/dz \, I_{z=0} = \rho \cdot J_{COMMON} \quad (4)$$

Where $\rho$ is the resistivity of the semiconductor substrate 702 at the point (x,y,z).

The boundary conditions of the first and second channel current densities at the second surface 720 may be expressed in the form of equation 5:

$$dV(x,y,z)/dz \, I_{z=c} = \rho \cdot J_{C1,2} \quad (5)$$

Where $\rho$ is the resistivity of the semiconductor substrate 702 at the point (x,y,z), and c is the thickness of the semiconductor substrate 702 in the z direction.

A general solution of Poisson's equation may be expressed in the form of Equation 6:

$$V(x,y,z) = \\ B_{00}z + \sum_{m=1}^{\infty} B_m \cos\left(\frac{m\pi x}{a}\right)\sinh\left(\frac{m\pi z}{a}\right) + \sum_{n=1}^{\infty} B_n \cos\left(\frac{n\pi y}{b}\right)\sinh\left(\frac{n\pi z}{b}\right) + \\ \sum_{m=1}^{\infty}\sum_{n=1}^{\infty} B_{mn} \cos\left(\frac{m\pi x}{a}\right)\cos\left(\frac{n\pi y}{b}\right)\sinh(k_{mn}\pi z) \quad (6)$$

Where $B_{00}$, $B_m$, $B_n$, and $B_{mn}$ are coefficients to be determined that provide the solution for the case being investigated. Solving Poisson's equation may provide a relatively quick estimate of the potential distribution, advantageously reducing time to develop a design for the semiconductor device 700.

The potential distribution in the semiconductor substrate 702 may be also estimated using a three dimensional modeling software program such as a finite element analysis software program. Such programs are commercially available at the time of this disclosure from several vendors, including, but not limited to, Synopsys and Silvaco. The solution of Poisson's equation may provide a convenient starting point for the modeling software program. Use of the modeling software program may provide a more detailed estimate of the potential distribution.

Figure 8:
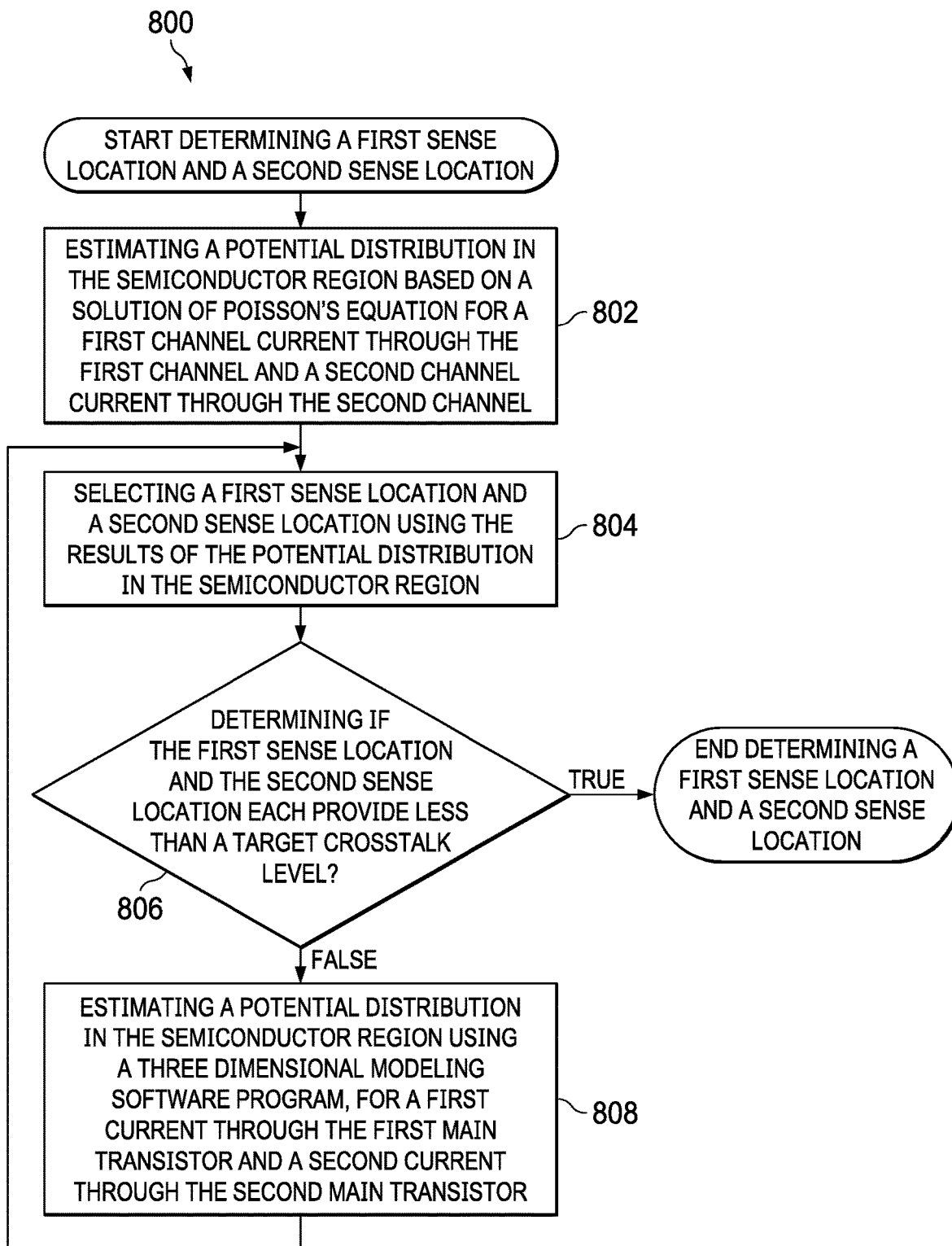
FIG. 8 is a flowchart disclosing an example method of determining a first sense location and a second sense location for a microelectronic device containing a common terminal transistor.

FIG. 8 is a flowchart disclosing an example method of determining a first sense location and a second sense location for a microelectronic device containing a common terminal transistor. The common terminal transistor may have properties per any of the examples disclosed in reference to FIG. 1 through FIG. 4. The method 800 of FIG. 8 may provide an implementation of steps 604, 606, and 608 of the method 600 for forming a microelectronic device containing a common terminal transistor, disclosed in reference to FIG. 6.

The method 800 begins with step 802: estimating a solution of Poisson's equation to provide an estimated potential distribution in the semiconductor region for a first channel current through the first channel and a second channel current through the second channel. Estimating the solution of Poisson's equation may proceed as disclosed herein, or by another approach.

Step 804 is selecting a first sense location and a second sense location. On a first pass through step 844, the first sense location and a second sense location may be estimated using the results of the solution of Poisson's equation. On subsequent passes through step 804, the first sense location and a second sense location may be estimated using results from other methods of estimating the potential distribution in the semiconductor region, as described in reference to step 808. The first sense location is selected so that a first sense transistor at the first sense location has a minimum cross-talk with respect to the second channel current. The second sense location is selected so that a second sense transistor at the second sense location has a minimum cross-talk with respect to the first channel current. The first sense location and the second sense location may be selected by any of several methods. In one example, the first sense location and the second sense location may be selected by a local optimization search method, which uses results of a previous proposed location to provide a new proposed location. In another example, the first sense location and the second sense location may be selected by a comparison of a figure of merit, such as cross-talk, for all locations in a grid array. Other methods for selecting the first sense location and the second sense location are within the scope of the instant example. On a first pass through step 844, the first sense location and a second sense location may be estimated using the results of the solution of Poisson's equation. On subsequent passes through step 804, the first sense location and a second sense location may be estimated using results from other methods of estimating the potential distribution in the semiconductor region, as described in reference to step 808.

Step 806 is a decision operation: determining if the first sense location and the second sense location each provide less than a target cross-talk level. If the result of step 806 is TRUE, that is, both the first sense location and the second sense location each do provide less than the target cross-talk level, the method 800 may be terminated, as indicated in the flowchart of FIG. 8. If the result of step 806 is FALSE, that is, either the first sense location or the second sense location, or both, does not provide less than the target cross-talk level, the method 800 is continued with step 808.

Step 808 is estimating the potential distribution in the semiconductor region for the first channel current and the second channel current, using a three dimensional modeling software program. The three dimensional modeling software program may use the solution of Poisson's equation from step 802 as a starting point. After the potential distribution is estimated using the three dimensional modeling software program, the method 800 is continued by returning to step 804.

Steps 804, 806, and 808 may be iterated to provide more accurate estimates of the potential distribution in the semiconductor region. For example, a finer grid may be used in the three dimensional modeling software program in successive iterations.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a semiconductor substrate; and
   a common terminal transistor, including:
   a common node extending to a first surface of the semiconductor substrate;
   a first channel having a first channel node in the semiconductor substrate;
   a first sense transistor having a first sense node in the semiconductor substrate adjacent to the first channel node;
   a second channel having a second channel node in the semiconductor substrate; and
   a second sense transistor having a second sense node in the semiconductor substrate adjacent to the second channel node;
   wherein the first sense transistor is located at a first sense location so as to be configured to provide a first sense current that is representative of a first channel current through the first channel according to a first sense ratio, wherein the first sense ratio has less than a target value of cross-talk with respect to a second channel current through the second channel, and wherein the second sense transistor is located at a second sense location so as to be configured to provide a second sense current that is representative of the second channel current according to a second sense ratio, wherein the second sense ratio has less than the target value of cross-talk with respect to the first channel current.

2. The microelectronic device of claim 1, wherein the first channel is larger than the second channel.

3. The microelectronic device of claim 2, wherein a first lateral distance between a first center of the first sense transistor and a center point between the first channel and the second channel is smaller than a second lateral distance between a second center of the second sense transistor and the center point.

4. The microelectronic device of claim 1, wherein:
   the first channel includes a first vertical transistor;
   the first sense transistor includes a second vertical transistor;
   the second channel includes a third vertical transistor; and
   the second sense transistor includes a fourth vertical transistor.

5. The microelectronic device of claim 1, wherein:
   the first channel includes a first MOS transistor;
   the first sense transistor includes a second MOS transistor;
   the second channel includes a third MOS transistor; and
   the second sense transistor includes a fourth MOS transistor.

6. The microelectronic device of claim 5, wherein a first sense gate of the first sense transistor is electrically coupled to a first channel gate of the first channel, and a second sense gate of the second sense transistor is electrically coupled to a second channel gate of the second channel.

7. The microelectronic device of claim 5, wherein:
   the common node includes a common drain;
   the first channel node includes a first source node of the first channel;
   the first sense node includes a second source node of the first sense transistor;
   the second channel node includes a third source node of the second channel; and
   the second sense node includes a fourth source node of the second sense transistor.

8. The microelectronic device of claim 1, wherein:
   the first channel includes a first bipolar junction transistor;
   the first sense transistor includes a second bipolar junction transistor;
   the second channel includes a third bipolar junction transistor; and
   the second sense transistor includes a fourth bipolar junction transistor.

9. The microelectronic device of claim 1, wherein the target value of cross-talk is 1 percent.

10. The microelectronic device of claim 1, wherein:
    the first channel is laterally adjacent to the first sense transistor on at least three sides of the first sense transistor, with two of the sides being opposite from each other; and
    the second channel is laterally adjacent to the second sense transistor on at least three sides of the second sense transistor, with two of the sides being opposite from each other.

11. The microelectronic device of claim 1, wherein the microelectronic device is free of a compensation circuit which is configured to provide a compensation signal used to adjust the first sense current through the first sense transistor.

12. A method of forming a microelectronic device, comprising:
    providing a semiconductor substrate having a first surface, the semiconductor substrate including a region for a common terminal transistor, the region including a first region for a first channel of the common terminal transistor, and including a second region for a second channel of the common terminal transistor;
    estimating a potential distribution in the semiconductor substrate in the region for the common terminal transistor;
    determining a first sense location in the first region for a first sense transistor, wherein the first sense transistor is configured to provide a first sense current that is representative of a first channel current through the first channel according to a first sense ratio, wherein the first sense ratio has less than a target value of cross-talk with respect to a second channel current through the second channel;
    determining a second sense location in the second region for a second sense transistor, wherein the second sense transistor is configured to provide a second sense current that is representative of the second channel current according to a second sense ratio, wherein the second sense ratio has less than the target value of cross-talk with respect to the first channel current;

forming the first channel in the semiconductor substrate;
forming the first sense transistor in the semiconductor substrate at the first sense location;
forming the second channel in the semiconductor substrate; and
forming the second sense transistor in the semiconductor substrate at the second sense location.

13. The method of claim 12, wherein the potential distribution is estimated for values of the first channel current over a first operational current range factor greater than 30 and values of the second channel current over a second operational current range factor greater than 30.

14. The method of claim 12, wherein estimating the potential distribution in the semiconductor substrate includes estimating a solution of Poisson's equation in the semiconductor substrate, for the first channel current through the first channel and the second channel current through the second channel.

15. The method of claim 12, wherein estimating the potential distribution in the semiconductor substrate includes using a three dimensional modeling software program, for the first channel current through the first channel and the second channel current through the second channel.

16. The method of claim 12, wherein estimating the potential distribution in the semiconductor substrate is iterated.

17. The method of claim 12, wherein:
the first channel includes a first vertical transistor;
the first sense transistor includes a second vertical transistor;
the second channel includes a third vertical transistor; and
the second sense transistor includes a fourth vertical transistor.

18. The method of claim 12, wherein:
the first channel includes a first MOS transistor;
the first sense transistor includes a second MOS transistor;
the second channel includes a third MOS transistor; and
the second sense transistor includes a fourth MOS transistor.

19. The method of claim 18, wherein:
the common terminal transistor includes a common drain;
a first channel node includes a first source node of the first channel;
a first sense node includes a second source node of the first sense transistor;
a second channel node includes a third source node of the second channel; and
a second sense node includes a fourth source node of the second sense transistor.

20. The method of claim 12, wherein the target value of cross-talk is 1 percent.

* * * * *